(12) United States Patent
Kawaguchi et al.

(10) Patent No.: US 10,746,618 B2
(45) Date of Patent: Aug. 18, 2020

(54) LOAD MEASURING DEVICE AND LOAD MEASURING METHOD

(71) Applicant: FUJI CORPORATION, Chiryu-shi (JP)

(72) Inventors: Koji Kawaguchi, Kasugai (JP); Kohei Sugihara, Nishio (JP); Junichi Narita, Anjo (JP)

(73) Assignee: FUJI CORPORATION, Chiryu-shi (JP)

( * ) Notice: Subject to any disclaimer, the term of this patent is extended or adjusted under 35 U.S.C. 154(b) by 179 days.

(21) Appl. No.: 15/772,656

(22) PCT Filed: Nov. 4, 2015

(86) PCT No.: PCT/JP2015/081015
§ 371 (c)(1),
(2) Date: May 1, 2018

(87) PCT Pub. No.: WO2017/077594
PCT Pub. Date: May 11, 2017

(65) Prior Publication Data
US 2019/0154528 A1    May 23, 2019

(51) Int. Cl.
*G01L 5/00* (2006.01)
*H05K 13/04* (2006.01)
*H05K 13/08* (2006.01)

(52) U.S. Cl.
CPC .......... *G01L 5/0038* (2013.01); *G01L 5/0076* (2013.01); *H05K 13/04* (2013.01); *H05K 13/082* (2018.08)

(58) Field of Classification Search
CPC ... G01L 5/0038; G01L 5/0076; H05K 13/082; H05K 13/04
See application file for complete search history.

(56) References Cited

U.S. PATENT DOCUMENTS 6,328,362 B1 * 12/2001 Isogai ............... H05K 13/0409
  294/185
7,246,430 B2 * 7/2007 Yonezawa ............ H05K 13/082
  29/740

(Continued)

FOREIGN PATENT DOCUMENTS

JP  2009-188002 A    8/2009
JP  4484823 B2 *  6/2010  ........... H05K 13/082
WO  WO 2005/027614 A1   3/2005

OTHER PUBLICATIONS

International Search Report dated Feb. 2, 2016 in PCT/JP2015/081015 filed Nov. 4, 2015.

*Primary Examiner* — Freddie Kirkland, III
(74) *Attorney, Agent, or Firm* — Oblon, McClelland, Maier & Neustadt, L.L.P.

(57) ABSTRACT

A load measuring device is provided with load sensor, data logger, and measurement start switch on body. When switch section is pressed down by a suction nozzle, load sensor outputs detection voltage to data logger in accordance with the size of the pressing load. Data logger records detection voltage for a specified time only from the time it starts receiving high level start recording signal from measurement start switch. By this, data logger does not record detection voltage until high level start recording signal is received from measurement start switch, thus does not incorrectly record vibrations and the like during conveyance as the load.

10 Claims, 7 Drawing Sheets

(56) References Cited

U.S. PATENT DOCUMENTS

| | | | | |
|---|---|---|---|---|
| 7,325,298 | B2* | 2/2008 | Kobayashi | H05K 13/046 |
| | | | | 29/740 |
| 8,413,322 | B2* | 4/2013 | Higuchi | H01L 24/75 |
| | | | | 29/832 |
| 9,010,615 | B2* | 4/2015 | Yoshimoto | H01L 21/67144 |
| | | | | 228/103 |
| 9,992,919 | B2* | 6/2018 | Kawaguchi | H05K 13/0413 |
| 10,440,869 | B2* | 10/2019 | Kawaguchi | H05K 13/082 |
| 10,500,737 | B2* | 12/2019 | Budiman | B25J 15/0616 |
| 2005/0071991 | A1* | 4/2005 | Yonezawa | H05K 13/0413 |
| | | | | 29/740 |
| 2018/0027708 | A1* | 1/2018 | Kawaguchi | H05K 13/0853 |
| | | | | 29/739 |
| 2018/0368296 | A1* | 12/2018 | Fujishiro | H05K 13/0413 |

\* cited by examiner

LOAD MEASURING DEVICE AND LOAD MEASURING METHOD

TECHNICAL FIELD

The present application relates to a load measuring device for measuring a load.

BACKGROUND ART

With a component mounter that mounts an electronic component (also referred to as simply as "component") on a circuit board (also referred to as simply as "board"), in order to curtail problems such as board damage and electrical connection problems, there is a requirement to set an appropriate value for a load with which a component is pressed against a board. Also, as recent components are more integrated, smaller, and thinner, it is desirable to more accurately manage the load with which components are pressed. With respect to this, there are load measuring devices for measuring a pressing load on a component by a suction nozzle of a mounting head when mounting the component on a board (for example, see patent literature 1).

The load measuring device disclosed in patent literature 1 is connected via a connection cord to a personal computer that displays measurement results or the like. With the load measuring device, the resistance value of an internal strain gauge changes as a load is applied to a suction nozzle. The load measuring device outputs a signal (such as a voltage) to the personal computer in accordance with the changing resistance value of the strain gauge.

CITATION LIST

Patent Literature

Patent literature 1: JP-A-2009-188002

BRIEF SUMMARY

Technical Problem

Technological developments have led to the measuring accuracy of load measuring devices improving as circuit designs are improved and measuring methods changed. For example, among piezoelectric load sensors that use the piezoelectric properties of quartz, there are sensors with high detection accuracy. Thus, one may consider using such a high accuracy load sensor when setting and managing pressing loads of suction nozzles.

However, a load measuring device as given above, for example, is mounted on a measurement-use board. A mounted measurement-use board, similar to a normally produced board, is conveyed along a conveyance path inside a component mounter from an upstream side to a work position at which components are mounted on a board. The measurement-use board is held at a work position by a board holding section. In this state, the load measuring device measures the pressing load of the suction nozzle. Thus, a user performing measurements must convey the load measuring device along the conveyance path. Therefore, the load measuring device, when using a measuring method with high detection accuracy or sensitivity, may incorrectly measure as a load an external force due to vibration during fixing work as the board is held or while it is being conveyed along the conveyance path.

The present disclosure takes account of such circumstances and an object thereof is to provide a load measuring device and a loading measuring method that curtail mistaken measurements.

Solution to Problem

To solve the above problems, a load measuring device of the present disclosure is for measuring a pressing load applied by a mounting head to a component in a mounter having the mounting head that applies a pressing force when mounting the component on a board, the load measuring device including: a body; a start command section provided on the body, the start command section being configured to issue a command to start acquiring the pressing load based on a start instruction from the mounter; and a load acquiring section configured to acquire the pressing load in accordance with the command from the start command section.

Also, the present disclosure is not limited to a load measuring device and may be realized as a load measuring method for measuring a pressing load.

Advantageous Effects

A load measuring device of the present disclosure is provided with a body, a start command section provided on the body, and a load acquiring section. The start command section issues a command to the load acquiring section to start acquiring the pressing load based on the start instruction from the mounter. The load acquiring section, based on the command from the start command section, acquires the pressing load of the pressing force applied by the mounting head. Thus, the load acquiring section does not perform entering, saving or the like of the pressing load until receiving the command. That is, even if such pressing loads are received, they are not processed as valid data. Accordingly, with this load measuring device, it is possible to perform acquiring in accordance with the timing at which pressing force is applied by the mounting head without acquiring a pressing load during conveyance along the conveyance path or the like. As a result, mistaken measurements of the pressing load are curtailed, and it is possible to appropriately measure the pressing load due to the mounting head.

DESCRIPTION OF EMBODIMENTS

A mounter that measures a load using a load measuring device of the present disclosure is described below in detail with reference to the figures.

Configuration of Substrate Work System

Figure 1:
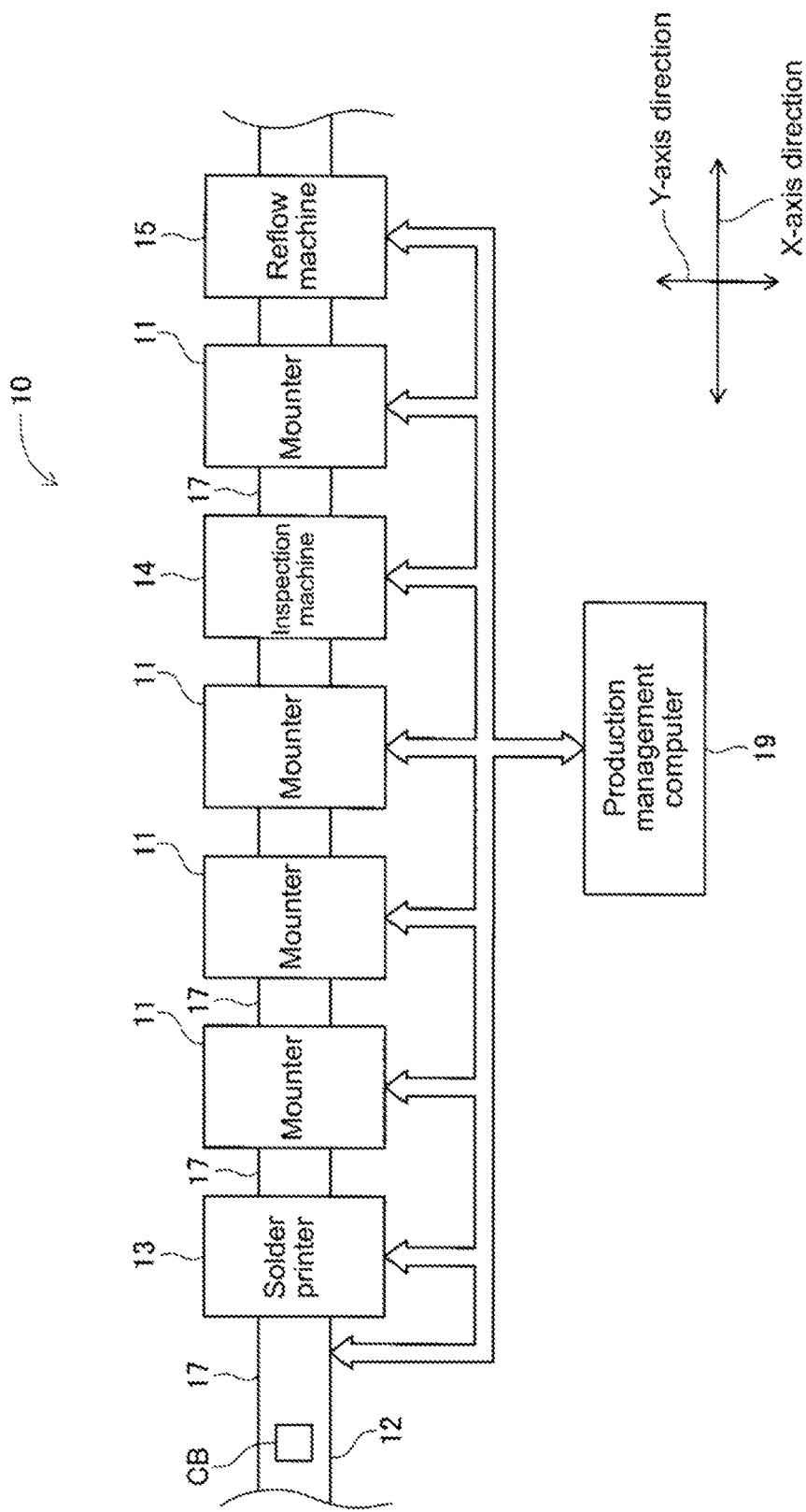
FIG. 1 schematically shows the configuration of a board work system lined up along a component mounting line.

FIG. 1 schematically shows the configuration of board work system 10 provided with mounter 11 of an embodiment. Board work system 10 is a system for mounting components on circuit board (also referred to as "board") CB. Board work system 10 includes one component mounting line 12. Board CB is conveyed along component mounting line 12 from left to right as shown in FIG. 1, with mounting related work being performed by various machines. Component mounting line 12 is configured from multiple (in this embodiment, four) mounters 11, solder printer 13, inspection machine 14, reflow machine 15, and board handlers 17 that are connected. The machines are arranged adjacent to each other in a single line and overall control is performed by production management computer 19. Note that, in the descriptions below, the X-axis direction refers to the direction in which the machines are lined up and the Y-axis direction refers to a direction that is parallel to the flat surface of board CB and perpendicular to the X-axis direction.

Solder printer 13 prints solder paste on board CB. Mounters 11 mount components on the board CB printed with solder paste. Details of mounters 11 are described later. Inspection machine 14 inspects for things such as the state of components mounted on board CB, and the presence of foreign matter. Reflow machine 15 heats the solder paste so that it melts, then allows it to cool and harden, so as to complete the mounting of the components. Board handlers 17 are provided in component mounting line 12 upstream and downstream of each of the mounters 11. Board handlers 17 convey boards CB to the next machine, hold boards CB on standby, or flip boards CB.

Configuration of Mounters

Figure 2:
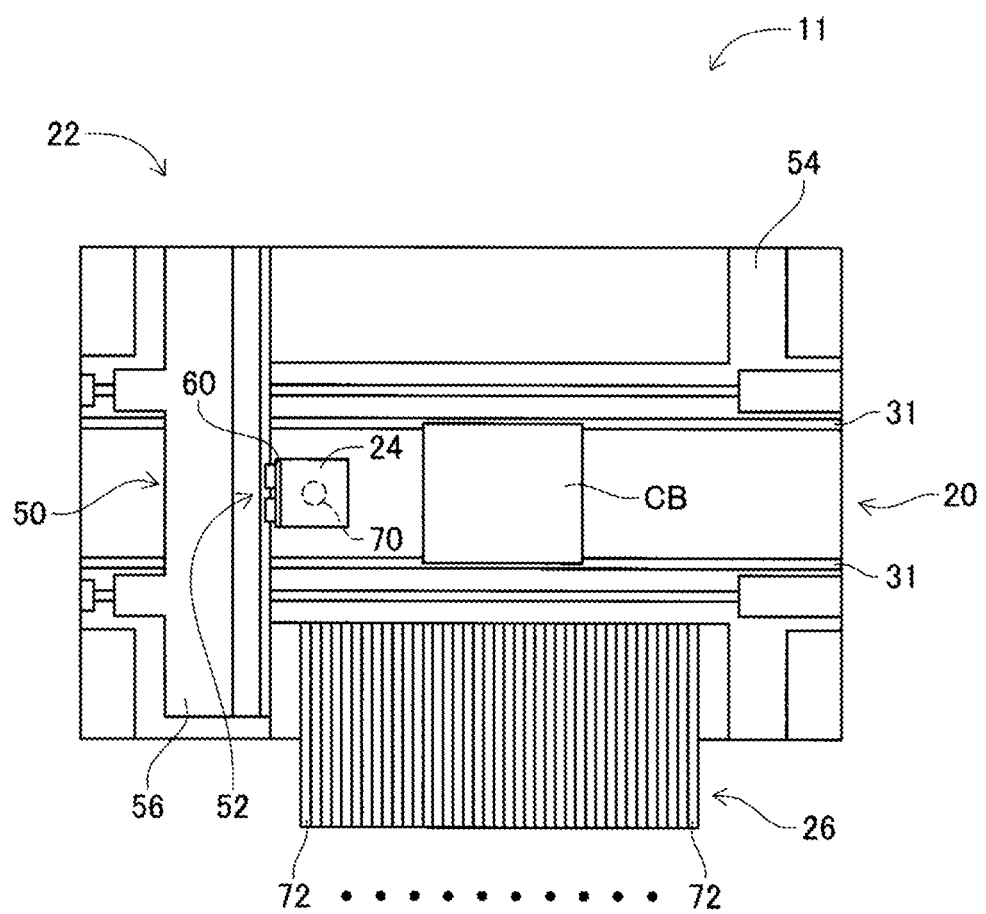
FIG. 2 is a plan view of a mounter.

FIG. 2 is a plan view of mounter 11. As shown in FIG. 2, mounter 11 includes conveyance device 20, mounting head moving device (hereinafter also referred to as "moving device") 22, mounting head 24, and supply device 26.

Figure 3:
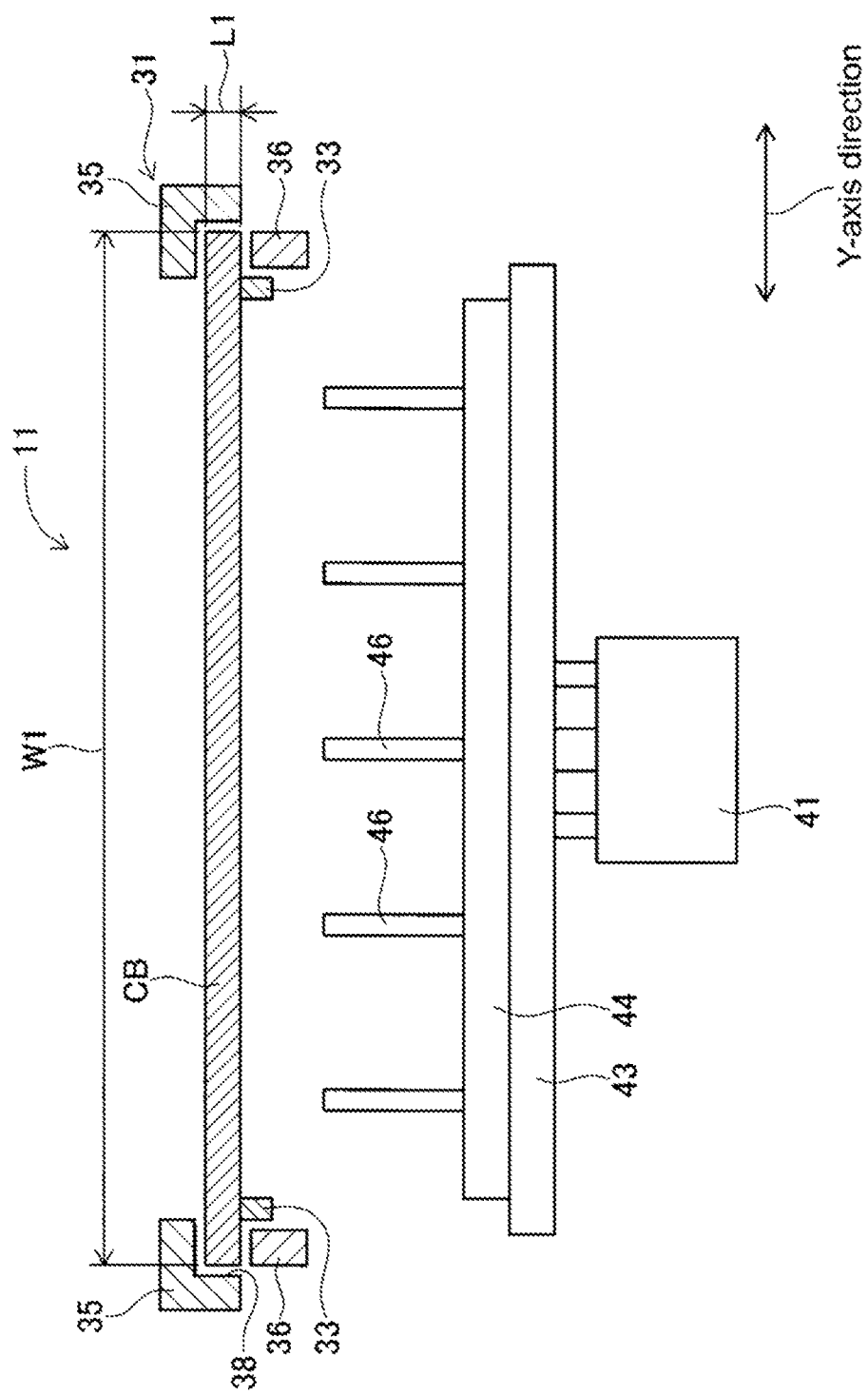
FIG. 3 is a cross section of the mounter with a board arranged at a work position.

Conveyance device 20 includes conveyor 31 that extends in the X-axis direction. Board CB is held and conveyed in the X-axis direction by conveyor 31. FIG. 3 shows a work position of mounter 11 in a cross section taken along a plane perpendicular to the X-axis direction. As shown in FIG. 3, conveyor 31 includes conveyor belts 33, stoppers 35, and clampers 36. A pair of conveyor belts 33 is provided separated by a specified distance in the Y-axis direction, and the conveyor belts are rotated by the driving of an electromagnetic motor (not shown). Conveyor belts 33 rotate with board CB loaded on them, such that board CB is conveyed to a specified work position (for example, the position shown in FIG. 2).

Stopper 35 extends in the X-axis direction and has an L-shaped cross section. Clampers 36 sandwich board CB at the work position, and are provided at positions facing stoppers 35 in the vertical direction. Conveyor 31 rotates conveyor belts 33 to convey board CB to the work position and raise clampers 36. Board CB is sandwiched between clampers 36 and stoppers 35 so as to be fixedly held at the work position. Note that, the thickness of board CB in the vertical direction is, for example, 2 mm.

Also, mounter 11 adjusts the rail width of conveyor 31 (the distance in the Y-axis direction between conveyor belts 33, stoppers 35, and clampers 36) in accordance with the board width W1 of board CB being produced. Stoppers 35 are provided facing the edge of board CB being conveyed separated by gap 38. Thus, conveyor 31 is able to convey board CB smoothly.

Also, raising and lowering table 43 capable of being raised and lowered by drive section 41 (for example, an air cylinder) is provided at the work position of mounter 11. Raising and lowering table 43 is plate-shaped and is provided below conveyor 31 and within conveyor 31 in the Y-axis direction. Backup base 44 is provided on raising and lowering table 31 in an exchangeable manner. Backup base 44 is plate-shaped and can be exchanged based on the type (for example, size) of board CB. Multiple backup pins 46 stand upright on the upper surface of backup base 44. Mounter 11, when mounting components, drives drive section 41 to raise raising and lowering table 43, such that backup pins 46 contact the underside of board CB held in position by stoppers 35 and clampers 36. Thus, backup pins 46 support board CB such that it does not bend during component mounting.

Also, as shown in FIG. 2, moving device 22 includes X-axis direction slide mechanism 50 and Y-axis direction slider mechanism 52. X-axis direction slide mechanism 50 has X-axis slider 56 provided on base 54 so as to be movable in the X-axis direction. X-axis slider 56 is moved to any position in the X-axis direction by the driving of an electromagnetic motor (not shown). Also, Y-axis direction slide mechanism 52 includes Y-axis slider 60. Y-axis slider 60 is provided on a side surface of X-axis slider 56 so as to be movable in the Y-axis direction. Y-axis slider 60 is moved to any position in the Y-axis direction by the driving of an electromagnetic motor (not shown). Mounting head 24 is attached to Y-axis slider 60. According to such a structure, mounting head 24 is moved to any position on base 54 by moving device 22. Note that, mounting head 24 is removable from Y-axis slider 60 and can be exchanged with another head in accordance with the work to be performed.

Mounting head 24 is for mounting components on board CB. Mounting head 24 includes suction nozzle 70 provided on a lower surface of mounting head 24. Suction nozzle 70 is connected to a positive and negative pressure supply device (not shown) via a negative pressure air and positive pressure air passage. Suction nozzle 70 picks up and holds a component using negative pressure, and releases the held component using positive pressure. Also, mounting head 24 has a raising and lowering device (not shown) that raises and lowers suction nozzle 70. Mounting head 24 changes the vertical position of suction nozzle 70 that holds a component using the raising and lowering device. Note that, suction nozzle 70 is removably attached to mounting head 24, such that suction nozzle 70 can be exchanged in accordance with the component to be held.

Supply device 26 is a feeder type supply device that includes multiple tape feeders 72. Tape feeders 72 house taped components in a wound state. Taped components are components that have been put into tape. Tape feeder 72 feeds taped components using a feeding device (not shown) so as to supply components to the supply position.

Mounting Work by Mounter

Mounter 11 uses the above configuration to perform work of mounting components on board CB. More specifically, mounter 11 uses conveyance device 20 to convey board CB conveyed from upstream board handler 17 to the work position. Stoppers 35 and clampers 36 fixedly hold board CB at the work position. Also, tape feeder 72 feeds taped components so as to supply components to the supply position. Mounting head 24 moves above the supply position of tape feeder 72 and picks up and holds a component using suction nozzle 70. Mounting head 24 then moves about board CB arranged at the work position and mounted the held component on board CB. When mounter 11 has completed work of mounting components, the downstream board handler 17 conveys board CB to a downstream machine.

Configuration of Load Measuring Device

Figure 4:
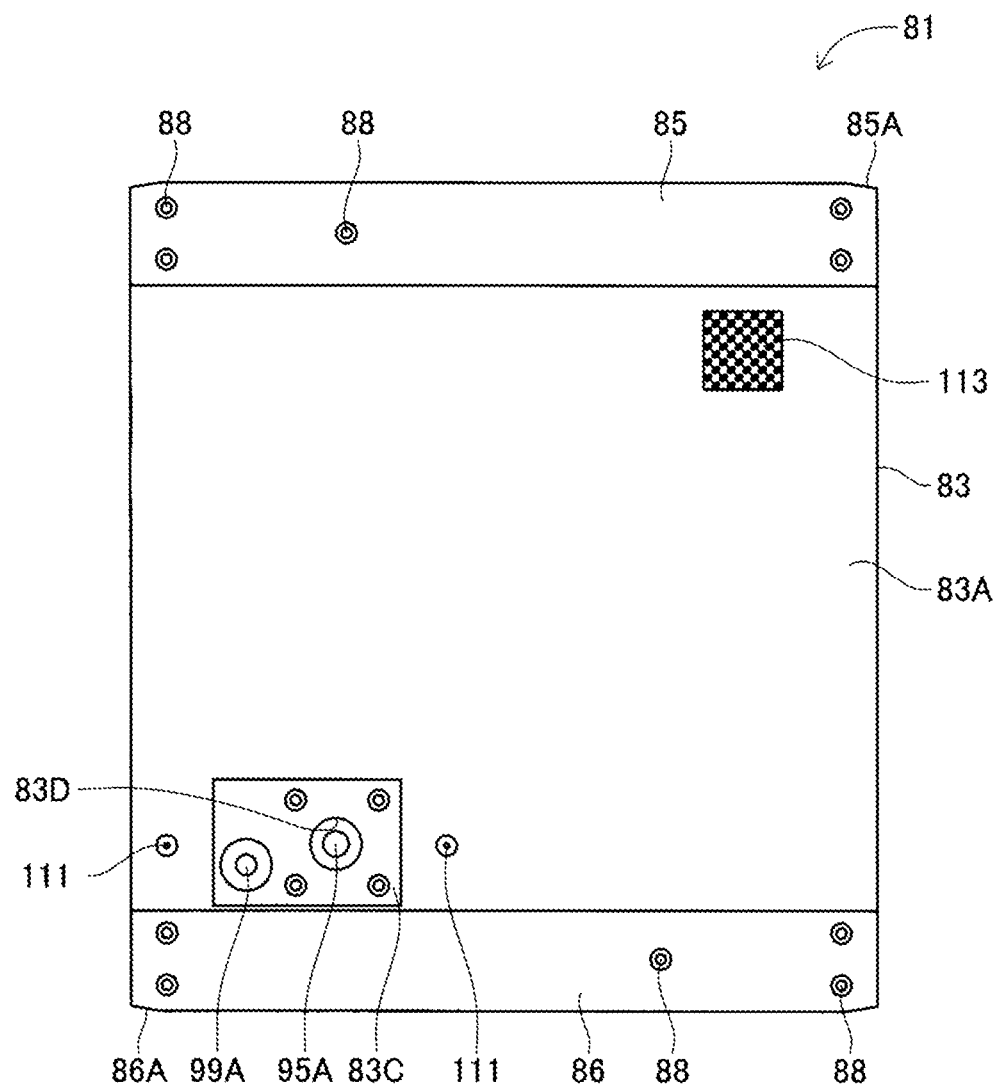
FIG. 4 is a plan view of a load measuring device.
Figure 5:
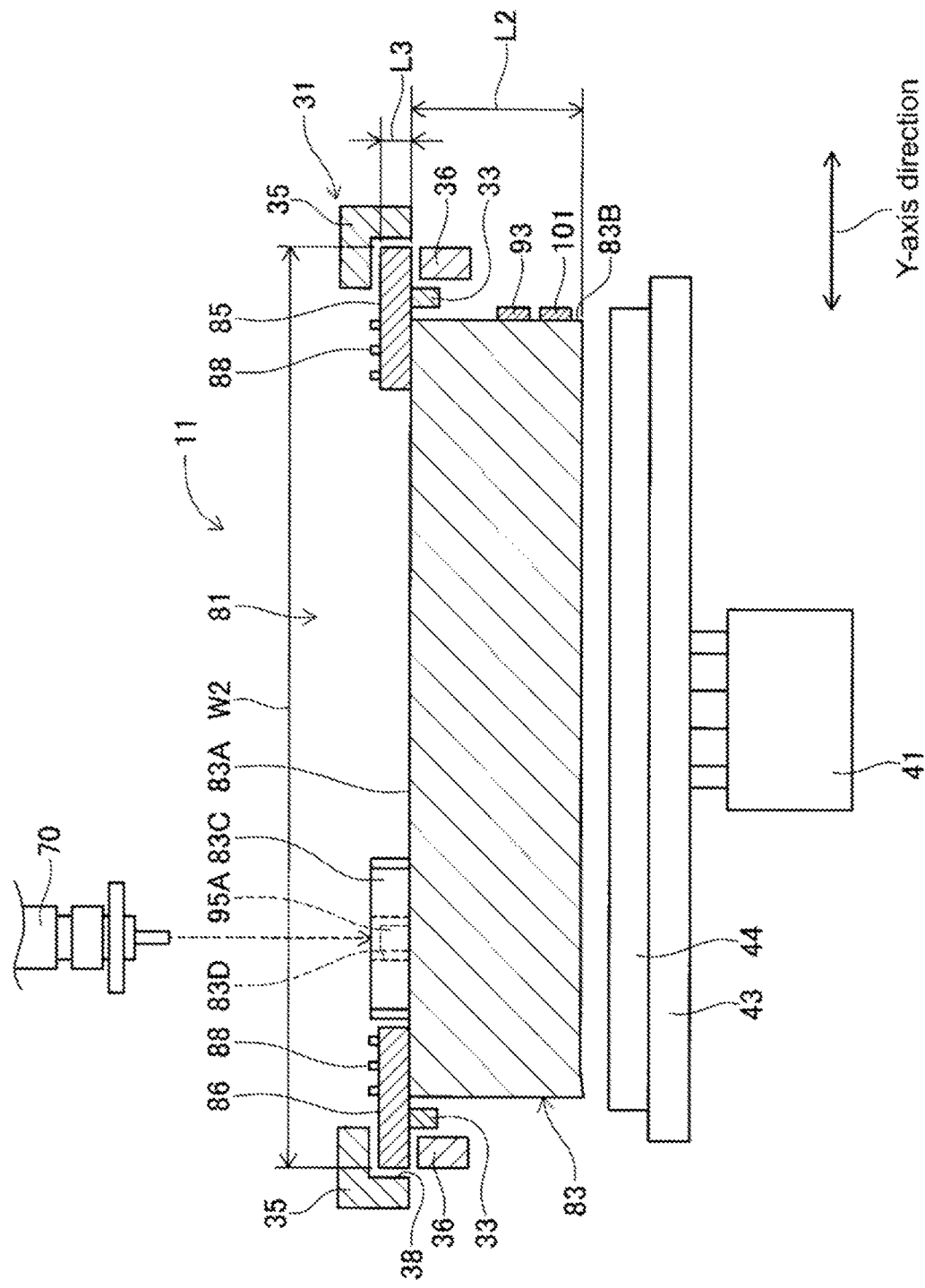
FIG. 5 is a cross section of the mounter with the load measuring device arranged at the work position.
Figure 6:
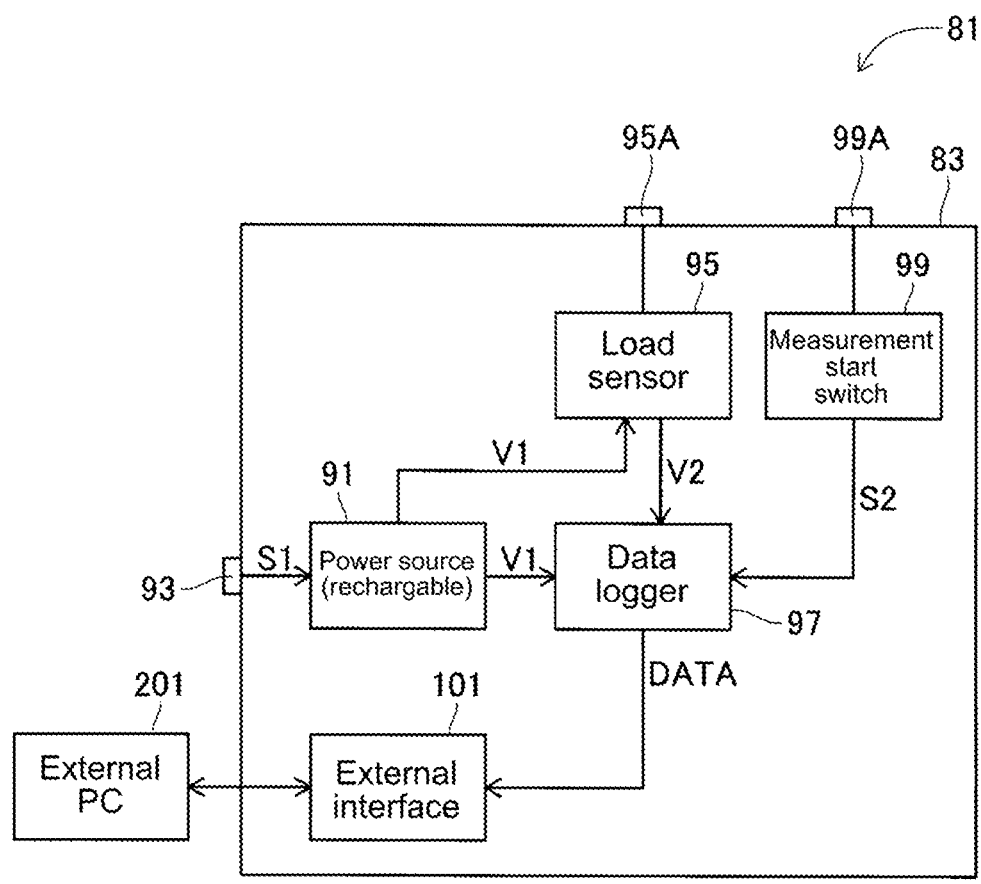
FIG. 6 is a block diagram of the load measuring device.

Described next is the configuration of load measuring device 81 of an embodiment. FIG. 4 shows a plan view of load measuring device 81 of the embodiment. FIG. 5 is a cross section view of load measuring device 81 and shows load measuring device 81 arranged at the work position of mounter 11. That is, compared to FIG. 3, FIG. 5 shows load measuring device 81 arranged in place of board CB. Also, FIG. 6 shows the electrical configuration of load measuring device 81.

Note that, in FIG. 5, backup base 44 is shown with backup pins 46 removed. This enables a larger space to be maintained between backup base 44 and conveyor 31. Also, in descriptions below, positions and the like of components of load measuring device 81 are given using directions (X-axis direction and Y-axis direction) when load measuring device 81 is conveyed.

As shown in FIGS. 4 and 5, load measuring device 81 includes body 83 and holding plates 85 and 86 attached to an upper surface of housing 83. Body 83 is substantially rectangular when viewed from above. Body 83 extends in the X-axis direction and the Y-axis direction and is a thick plate with a specified thickness in the vertical direction. Thickness L2 (refer to FIG. 5) in the vertical direction of body 83 is, for example, 50 mm. Note that, in a case in which load measuring device 81 is configured as a thin item, load measuring device 81 may be conveyed by conveyor with backup pins 46 remaining attached to backup base 44.

Holding plates 85 and 86 are provided at either end in the Y-axis direction at upper surface 83A of body 83. Holding plates 85 and 86 are plates extending in the X-axis direction while having approximately the same width in the Y-axis direction. Thickness L3 in the vertical direction of holding plates 85 and 86 is the same (for example, 2 mm) as the thickness of board CB shown in FIG. 3. Holding plates 85 and 86 extend along the flat plane of upper surface 83A towards the outside from the edge of body 83 in the Y-axis direction. Conveyor belts 33 support an underside of a portion of holding plates 85 and 86 that protrudes towards the outside in the Y-axis direction. Also, each of holding plates 85 and 86 is fixed to body 83 by multiple (in this embodiment, five) screws 88.

Conveyor 31 conveys load measuring device 81 in a state with the portions of holding plates 85 and 86 that protrude towards the outside of body 83 loaded on conveyor belts 33. Width W2 of load measuring device 81 in the Y-axis direction is approximately the same as board width W1 (refer to FIG. 3) of board CB. Therefore, stoppers 35 are provided facing holding plates 85 and 86 of load measuring device 81 being conveyed separated by gap 38. Thus, conveyor 31 is able to convey load measuring device 81 smoothly.

Also, chamfer sections 85A are formed in holding plate 85 on an external edge in the Y-axis direction at both ends in the X-axis direction. Similarly, chamfer sections 86A are formed in holding plate 86. By providing chamfer sections 85A and 86A in holding plates 85 and 86, the problem of holding plates 85 and 86 catching on stoppers 35 of conveyor 31 and thereby hindering conveyance is curtailed. This also enables conveyor 31 to convey load measuring device 81 smoothly.

As shown in FIG. 6, load measuring device 81 includes items such as power source 91, power switch 93, load sensor 95, data logger 97, measurement start switch 99, and external interface 101. Power source 91, for example, is a rechargeable battery that supplies direct current voltage V1 to load sensor 95 and data logger 97.

Power source switch 93 is used to switch between supplying voltage V1 from power source 91 to load sensor 95 and the like, and stopping the supply. Power switch 93 is attached to side surface 83B (refer to FIG. 5) of body 83. Power switch 93, for example, is a slide switch or a tact switch (registered trademark), and causes on/off signal S1 to be output to power source 91 based on operations of a user. Power switch 93 starts supply of voltage V1 to load sensor 95 and the like, or stops the supply, in accordance with the on/off signal S1 from power switch 93.

Load sensor 95 detects a pressing force (such as a force that presses a component) of suction nozzle 70 of mounting head 24. Load sensor 95, for example, is a piezoelectric load sensor and is configured from a single axis sensor that detects only the load in the vertical direction. Note that, load sensor 95 may by another type of load sensor, such as a strain gauge. Also, load sensor 95 may be configured from a multiple axis load sensor capable of detecting the load in multiple directions.

Load sensor 95 includes switch section 95A attached to upper surface 83A of body 83. As shown in FIG. 4, measurement plate 83 is provided on upper surface 83A at a position adjacent to holding plate 86. Measurement plate 83C is approximately a long rectangle when viewed in the vertical direction. Through-holes 83D are provided piercing measurement plate 83C in the vertical direction. Switch section 95A is approximately cylindrical, and is inserted through through-hole 83D in the vertical direction. With load sensor 95, when switch section 95A is pressed down by suction nozzle 70, compressive stress occurs inside the quartz piezoelectric element (not shown) due to the load, and load sensor 95 outputs analog detection voltage V2 in accordance with the size of the stress. Load sensor 95 outputs detection voltage V2 to data logger 97. Note that, load sensor 95 may be provided with an amplifier or the like that amplifies detection voltage V2.

Measurement start switch 99 includes pressure switch 99A that can be operated by suction nozzle 70. Pressure switch 99A is provided at a position on measurement plate 83C adjacent to switch section 95A. As shown in FIG. 5, measurement start switch 99, for example, is off when pressure switch 99A is not being pressed by suction nozzle 70, and outputs low level start recording signal S2 to data logger 97. Further, measurement start switch 99, for example, when pressure switch 99A is pressed down to a specified reference position by suction nozzle 70, outputs high level start recording signal S2 to data logger 97.

Data logger 97, is set to not perform recording of detection voltage V2 received from load sensor 95 while receiving low level start recording signal S2. Also, data logger 97 is set to record detection voltage V2 for a specified time only from the time it starts receiving high level start recording signal S2 from measurement start switch 99. This specified time is set according to an operating sequence of suction nozzle 70, more specifically, is set according to the actual work state and operating state when mounting components on board CB. With the above configuration, data logger 97 records detection voltage V2 received from load sensor 95 for a specified time only from when pressure switch 99A is pressed by suction nozzle 70. Data logger 97 records the received detection voltage V2 as load data. Thus, it is possible to drastically reduce unnecessary data from before and after load measurement.

External interface 101 is for connecting to an external device such as external PC 201. As shown in FIG. 5, external interface 101, for example, is attached to side surface 83B below power switch 93. For example, an interface that conforms to the USB (Universal Serial Bus) standard may be used as external interface 101.

For example, a user may read load data from data logger 97 using external PC 201 connected to external interface 101. Thus, a user can display and check desired load data on external PC 201. For example, a user can check whether the pressing load of suction nozzle 70 is normal based on whether the peak value of the load data is within a desired range.

Also, as shown in FIG. 4, two fiducial marks 111 for detecting an accurate position of load measuring device 81 fixed at the work position, that is, for detecting an accurate position of switch section 95A and pressure switch 99A, are provided on upper surface 83A. Fiducial marks 111 are provided at each end to sandwich measurement plate 883C at both ends in the X-axis direction. Also, code section 113 positioned adjacent to holding plate 85 is provided on upper surface 83A. Code section 113, for example, is a 2D code for distinguishing load measuring device 81 from board CB. Note that, code section 113 may be another form of identification information such as a barcode, so long as it allows distinguishing between load measuring device 81 and board CB.

Mounter 11 captures code section 113 and fiducial marks 111 provided on upper surface 83A of load measuring device 81 using a camera (not shown) of mounting head 24 and acquires the image data. Mounter 11 detects accurate coordinates (position in the X-axis direction and the Y-axis direction) of positioned load measuring device 81 by image processing the captured image data of fiducial marks 111. Also, mounter 11 is able to determine whether an item is load measuring device 81 by image processing image data captured of code section 113.

Load Measuring Processing

Figure 7:
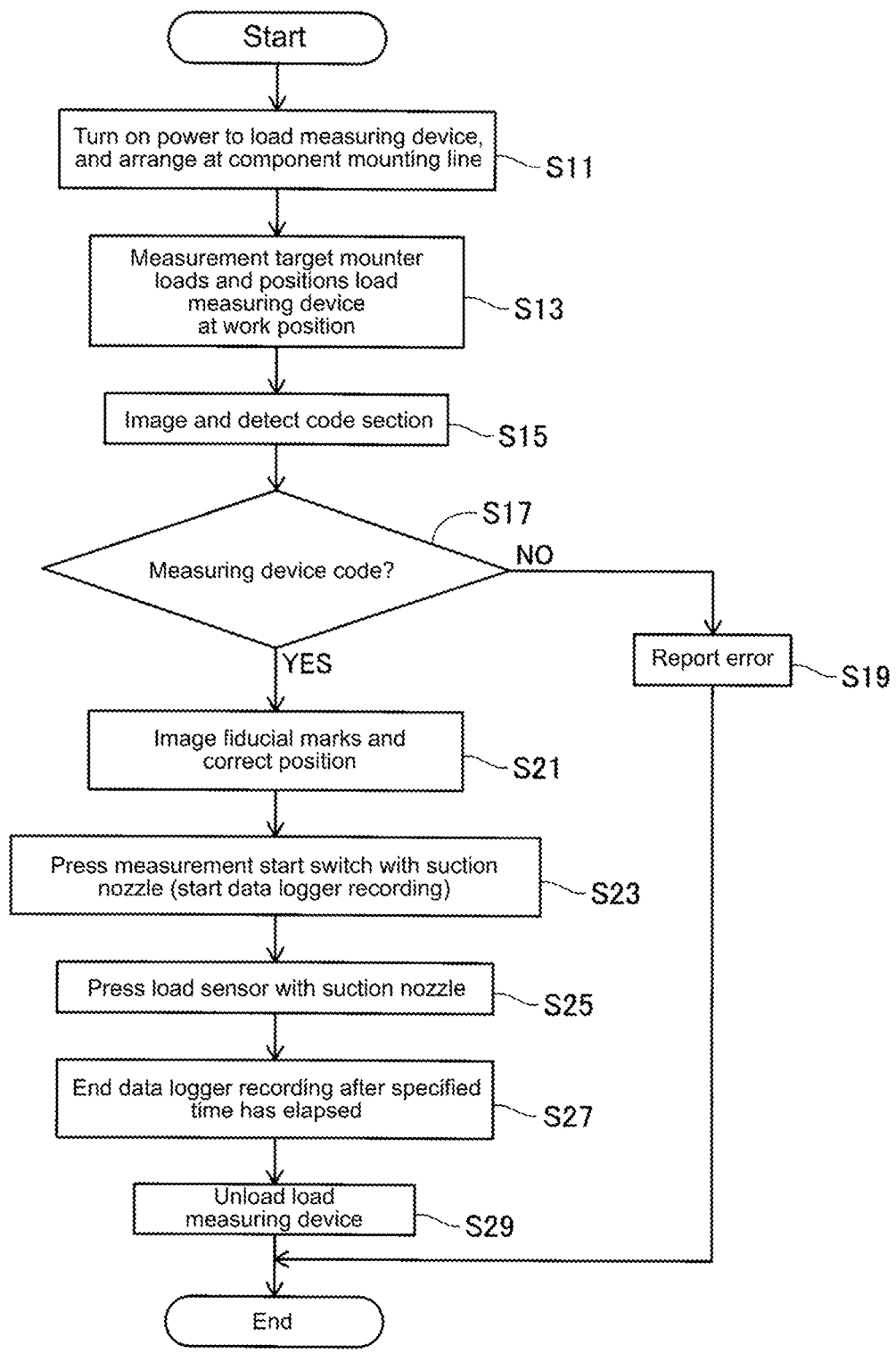
FIG. 7 is a flowchart showing load measuring steps.

A load measuring method of load measuring device 81 is described next with reference to FIG. 7. FIG. 7 is an example of load measuring. First, in step 11 (hereinafter step is abbreviated to "S"), a user operates power switch 93 of load measuring device 81 to turn it on. Power source 81 starts supplying voltage V1 to load sensor 95 and data logger 97 in accordance with the receiving on/off signal S1 that represents an on state.

A user arranges load measuring device 81 with the power turned on at an upstream side of component mounting line 12 of board work system 10. The user, for example, uses production management computer 19 to execute control data for selectively operating only the mounter 11 on which it is desired to perform measurement. Thus, board work system 10 conveys load measuring device 81 from an upstream side of component mounting line 12 (a solder printer 13 side) to a work position of the measurement target mounter 11. Also, board work system 10 does not perform work using solder printer 13 or the like while load measuring device 81 is being conveyed. And, the measurement target mounter 11, based on the control data acquired form production management computer 19 operates mounting head 24 and suction nozzle 70 and performs the following work with respect to load measuring device 81.

Here, for example, load measuring device 81, while being conveyed through component mounting line 12, is subject to vibrations from various machines such as board handlers 17. Thus, load sensor 95, when having high detection accuracy and sensitivity may incorrectly detect this vibration as load. However, while load measuring device 81 of the present embodiment is being conveyed, data logger 97 is receiving lower level start recording signal S2, so does not record any detected voltage V2 received from load sensor 95. Thus, load measuring device 81 curtails the incorrect recording of vibrations caused by conveyance as load in data logger 97. Also, with load measuring device 81 of the present embodiment, because incorrect measurements during conveyance are corrected, it is possible to use a sensor with a high detection level and sensitivity, for example, a piezoelectric sensor.

Next, the measurement target mounter 11 loads the load measuring device 81 from board handler 17 on the upstream side (S13). Mounter 11 adjusts the conveyance speed of load measuring device 81 in accordance with detection results of sensors (not shown) provided on conveyor 31 or the like and conveys load measuring device 81 to the work position. Conveyor 31 drives conveyor belts 33 to convey load measuring device 81 to the work position, then raises clampers 36 to position load measuring device 81 by sandwiching holding plates 85 and 86 between clampers 36 and stoppers 35 (S13).

Next, measurement target mounter 11 moves mounting head 24 based on control data received from production management computer 19 and captures an image of code section 113 of load measuring device 81 held at the work position. Mounter 11 detects code section 113 from the captured image (S15). Mounter 11 determines whether the detected code section 113 is identification information indicating load measuring device 81 (S17).

Mounter 11, in a case in which the detected code section 113 is determined not to be identification information of load measuring device 81 (S17: no), displays an error on a display section or sounds an alarm to report an error to the user (S19), then ends processing of FIG. 7. By this, a situation is prevented in which mounter 11 incorrectly performs load measurement on board CB. Also, the user is prompted to take necessary measures by the reporting of the error.

Conversely, in a case in which the detected code section 113 matches the identification information of load measuring device 81 (S17: yes), mounter 11 captures an image of the two fiducial marks 111 (S21). Mounter 11, based on the positions of the fiducial marks detected from the image data, detects the accurate positional coordinates of the positioned load measuring device 81. Mounter 11 performs correction of the coordinates to which mounting head 24 was moved in accordance with the positions of the detected fiducial marks 111 (S21). Thus, mounter 11 corrects the coordinate values in the X-axis direction and the Y-axis direction above load measuring device 81, and mounting head 24 can be more accurately moved to the positions of switch section 95A and pressure switch 99A.

Next, mounter 11 moves mounting head 24 above pressure switch 99A (S23). Mounter 11 lowers mounting head 24 to press pressure switch 99A with suction nozzle 70. Due to pressure switch 99A being pressed, measurement start switch 99 outputs high level start recording signal S2 to data logger 97. Data logger 97 starts recording detection voltage V2 for a specified time from that point (S23).

Next, mounter 11 moves mounting head 24 above switch section 95A, and presses switch section 95A using suction nozzle 70 (S25). Pressure sensor 95 outputs detection voltage V2 to data logger 97 in accordance with the pressing force due to suction nozzle 70.

Next, data logger 97, after the specified time from when high level start recording signal S2 was received from measurement start switch 99 has elapsed, stops recording detection voltage V2 (S27). Accordingly, the recording time by data logger 97 is set in advance to an appropriate time in accordance with the operation of mounting head 24 and suction nozzle 70, more specifically, in accordance with the operations of S21 and S23 above.

Next, measurement target mounter 11 conveys load measuring device 81 downstream (S29). Board work system 10 conveys the load measuring device 81 unloaded from measurement target mounter 11 downstream (towards reflow machine 15) (S29). Then, the user removes the load measuring device 81 unloaded from component mounting line 12. The user is able to read the load data of the desired mounter 11 by connecting the removed load measuring device 81 to external PC 201.

Note that, in the above embodiment, upper surface 83A is an example of a flat surface section. Holding sections 85 and 86 are examples of plate sections. Data logger 97 is an example of a storage section. Start measurement switch 99 is an example of a start command section. Pressure switch 99A is an example of a command input section. Fiducial mark 111 is an example of a position detection mark. Code section 113 is an example of an identification mark. Detection voltage V2 is an example of a load signal. S23 is an example of a command issuing process and an acquisition starting process. S25 is an example of a pressing load applying process.

The following effects are achieved by the above embodiments. Load measuring device 81 of an embodiment above is provided with load sensor 95, data logger 97, and start measurement switch 99 on body 83. When switch section 95A is pressed down by suction nozzle 70, load sensor 95 outputs detection voltage V2 to data logger 97 in accordance with the size of the pressing load. When pressure switch 99A is pressed down by suction nozzle 70, measurement start switch 99 outputs high level start recording signal S2 to data logger 97. Data logger 97 records detection voltage V2 for a specified time only from the time it starts receiving high level start recording signal S2 from measurement start switch 99. Thus, data logger 97 does not record detection voltage V2 until high level start recording signal S2 is received from measurement start switch 99. Accordingly, load measuring device 81 of the embodiment does not incorrectly measure vibrations and the like that occur during conveyance through component mounting line 12 as a pressing load. Also, load measuring device 81 starts measuring when pressure switch 99A is pressed down by mounting head 24. As a result, incorrect measurements are curtailed and it is possible to appropriately measure the pressing load.

Here, it may be considered to connect a load measuring device disclosed in the background art (JP-A-2009-188002) to a personal computer via a connection cord, and to issue an instruction to start measuring from the personal computer while monitoring operation at the mounters. However, in this case, the user must start load measurement by checking operation of the mounting devices and choosing the appropriate timing. Thus, the workload for load measurement is large.

In contrast, with load measuring device 81 of the embodiment, measurement start switch 99 is provided such that the timing of starting load measurement can be received externally. Measurement start switch 99 can be pressed by suction nozzle 70. Therefore, for measurement, it is not necessary for the user to issue instructions to load measuring device 81, so the workload is reduced.

Also, switch section 95A of load sensor 95 and pressure switch 99A of measurement start switch 99 of the embodiment are provided adjacent to each other on measurement plate 83C of body 83. Thus, the movement time of mounting head 24 during measurement of the pressing load is reduced.

Also, load measuring device 81 includes holding plates 85 and 86 with a thickness the same as thickness L1 of board CB. Load measuring device 81 is fixed at the work position in a similar manner as board CB, by holding plates 85 and 86 being sandwiched by clampers 36 and the like. With such a configuration, it is possible to fix load measuring device 81 at a work position of mounter 11 the same as board CB, and it is possible to measure the pressing load in a state closer to an actual work state.

Further, the present disclosure is not limited to the above example embodiments, and various changed or improved methods of embodiment are possible based on the knowledge of someone skilled in the art. For example, in an embodiment above, measurement start switch 99 is used as a start command section, but the means of issuing the command to start measuring is not limited to this. For example, mounter 11 may instruct load measuring device 81 to start measuring the load wirelessly using infrared waves or the like. In this case, a wireless receiver provided in load measuring device 81 is an example of the start command section. Also, for example, mounter 11 may instruct load measuring device 81 to start measuring the load wirelessly using light emitted from mounting head 24 or the like. Alternatively, load measuring device 81 may be provided with measurement start switch 99 on holding plate 85. In this case, mounter 11 can issue the instruction to start load measurement by start measurement switch 99 being pressed down while holding plate 85 is sandwiched by stopper 35 and clamper 36. Also, load measuring device 81, for example, may be provided with a timer, and be configured to start measuring based on the time it takes to be conveyed from the upstream side of component mounting line 12 to the measurement target mounter 11. Also, for example, load measuring device 81 may be configured to start measuring when pressure switch 99A is pressed once, and to stop measuring when pressure switch 99A is pressed a second time.

Also, in an embodiment above, measuring the load is performed by conveying load measuring device 81 from the upstream side of component mounting line 12, but the configuration is not limited to this. For example, a user may arrange load measuring device 81 by directly inserting it at the work position of mounter 11. In this case, it is possible to curtail incorrect measurement of load measuring device 81 of such an embodiment by not incorrectly measuring vibration and the like that occurs when load measuring device 81 is conveyed by hand to the work position.

Further, in an embodiment above, measurement start switch 99, for example, when pressure switch 99A is pressed down to a specified reference position by suction nozzle 70, outputs high level start recording signal S2 to data logger 97, but the timing of the output is not limited to this. For example, measurement start switch 99 may output high level start recording signal S2 after a specified time has elapsed since the pressing by suction nozzle 70. By this, it is possible to delay the timing of the recording to detection voltage V2 by data logger 97 by the specified time.

Similarly, data logger 97 starts recording of detection voltage V2 from when high level start recording signal S2 is received from measurement start switch 99, by the timing of starting measuring is not limited to this. For example, data logger 97 may record detection voltage V2 from a time counting back by a specified time from the time when high level start recording signal S2 started to be received as a reference. Alternatively, data logger 97 may start recording detection voltage V2 after a specified time has elapsed from when high level start recording signal S2 started to be received.

Also, load measuring device 81 may be provided with data logger 97. For example, load measuring device 81 may be provided with a sending section that wirelessly sends detection voltage V2 received from load sensor 95. Load measuring device 81 may send detection voltage V2 from the communication section to mounter 11 for a specified time only in accordance with receiving the high level start recording signal S2 from measurement start switch 99. With such a configuration too, it is possible to acquire a pressing load for a specified time from the point at which the start command was issued.

Also, in an embodiment above, mounting head 24 presses pressure switch 99A using suction nozzle 70, but the configuration is not limited to this. For example, mounting head 24 may press pressure switch 99A using another member (such as a chuck) that holds a component. Also, the configuration of load measuring device 81 of an embodiment above is just one example and the configuration may be changed as appropriate. For example, fiducial marks 111 are not limited to a quantity of two; one fiducial mark, or three or greater marks may be provided. Also, for example, pressure switch 99A and switch section 95A may be provided separated from each other. Also, for example, power switch 93 and external interface 101 may be provided on upper surface 83A.

REFERENCE SIGNS LIST

11: mounter; 24: mounting head; 81: load measuring device; 83: body; 83A: upper surface (flat plate section); 85, 86: holding plate (plate section); 95: load sensor (load acquiring section); 97: data logger (storage section); 99: measurement start switch (start command section); 99A: pressure switch (command input section); 111: fiducial mark (position detection mark); 113: code section (identification mark); CB: board; V2: detection voltage (load signal)

The invention claimed is:

1. A load measuring device for measuring a pressing load applied by a mounting head to a component in a mounter having the mounting head that applies a pressing force when mounting the component on a board, the load measuring device comprising:
a body configured to be conveyed by a conveyor of the mounter that conveys the board;
a start command section provided on the body, the start command section being configured to issue a command to start acquiring the pressing load based on a start instruction from the mounter; and
a load acquiring section provided on the body, the load acquiring section being configured to acquire the pressing load in accordance with the command from the start command section.

2. The load measuring device according to claim 1, wherein
the load acquiring section includes
a load sensor configured to output a load signal in accordance with a size of the pressing load from the mounting head, and
a storage section configured to store the load signal output from the load sensor, and
the start command section is configured to issue a command to start the storing of the load signal to the storage section in accordance with receiving the start instruction from the mounter.

3. The load measuring device according to claim 2, wherein
the start command section is a press switch by which the start instruction is entered due to pressing by the mounting head.

4. The load measuring device according to claim 2, wherein
the body includes a flat surface section, and
the load sensor and the start command section are arranged adjacently on the flat surface section.

5. The load measuring device according to claim 1, wherein
the body includes a plate section with a thickness the same as the board and that is configured to be storable in a region in which the board is held when the pressing force is applied by the mounting head.

6. The load measuring device according to claim 1, wherein
the body includes a position detection mark that indicates a position at which the load acquiring section is attached on the body.

7. The load measuring device according to claim 1, wherein
the body includes an identification mark used to identify the load measuring device from other members.

8. The load measuring device according to claim 1, further comprising:
a power source on the body that supplies power to the load acquiring section.

9. The load measuring device according to claim 8, further comprising:
a power switch on the body that switches the power from the power source to the load acquiring section.

10. A load measuring method, with respect to a mounter provided with a mounting head that applies a pressing force when mounting a component on a board, for measuring a pressing load applied on the component by the mounting head, using a load measuring device including a start command section provided on the body that is configured to issue a command to start acquiring the pressing load based on a start instruction from the mounter and a load acquiring section provided on the body that is configured to acquire the pressing load in accordance with the command from the start command section, the load measuring method comprising:
conveying the body of the load measuring device to a work position in the mounter by a conveyor of the mounter;
issuing the start instruction to the start command section from the mounter;
starting acquisition of the pressing load using the load acquiring section by the start command section; and
applying the pressing load by operating the mounting head such that the mounting head presses the load acquiring section.

* * * * *